(12) United States Patent
Yu

(10) Patent No.: US 6,339,017 B1
(45) Date of Patent: Jan. 15, 2002

(54) HARD MASK FOR INTEGRATED CIRCUIT FABRICATION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/596,993

(22) Filed: Jun. 20, 2000

(51) Int. Cl.[7] .......................................... H01L 21/4763
(52) U.S. Cl. ...................... 438/585; 438/584; 438/197; 438/595
(58) Field of Search ................................ 438/584, 585, 438/595, 197

(56) References Cited

U.S. PATENT DOCUMENTS

| | | |
|---|---|---|
| 5,889,302 A | 3/1999 | Liu |
| 5,936,280 A | 8/1999 | Liu |
| 6,031,264 A | 2/2000 | Chien et al. |
| 6,060,377 A * | 5/2000 | Xiang et al. ................. 438/585 |
| 6,133,129 A * | 10/2000 | Xiang et al. ................. 438/585 |

OTHER PUBLICATIONS

Yu, Bin, et al. "Ultra–Thin–Body Silicon–On–Insulator MOSFET's for Terabit–Scale Integration" Department of Electrical Engineering & Computer Sciences, University of California, Berkeley.

Huang, Xuejue, et al. "Sub 50–nm Fin FET: PMOS" Department of Electrical Engineering & Computer Sciences, University of California, Berkeley, 1999 IEEE.

* cited by examiner

*Primary Examiner*—Long Pham
(74) *Attorney, Agent, or Firm*—Foley & Lardner

(57) ABSTRACT

A method of manufacturing small structures or narrow structures on an ultra-large scale integrated circuit utilizes a hard mask. A mask layer can be deposited over a top surface of a material above a semiconductor substrate. A mask layer can be lithographically patterned to have a feature. The side walls of the feature can be oxidized. The oxidized side walls can be removed to reduce the size of the feature below one lithographic feature. The material underneath mask layer can be etched in accordance with the feature without the oxidized side walls.

20 Claims, 7 Drawing Sheets

HARD MASK FOR INTEGRATED CIRCUIT FABRICATION

CROSS REFERENCE TO RELATED APPLICATIONS

This application is related to U.S. patent application Ser. No. 09/597,624, filed on an even date herewith by Yu, entitled "A Process for Forming Gate Conductors." This application is also related to U.S. patent application Ser. No. 9/597,598, filed on an even date herewith by Yu entitled "A Process for Forming Multiple Active Lines and Gate-All-Around MOSFETs." Both applications are assigned to the Assignee of the present application.

FIELD OF THE INVENTION

The present invention relates generally to an integrated circuit (IC) and the fabrication of an integrated circuit. More particularly, the present invention relates to an integrated circuit and a method of making an integrated circuit having small structures or patterns.

BACKGROUND OF THE INVENTION

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. The gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

Generally, it is desirous to manufacture smaller transistors to increase the component density on an integrated circuit. It is also desirous to reduce the size of integrated circuit structures, such as vias, contacts, conductive lines, capacitors/resistors, structures, solutions, interconnects, etc.

Lithographic tools are utilized to form transistors and other structures on the integrated circuit. As transistors and other integrated circuit structures are reduced in size (CMOS scaling), the demands on lithographic tools have increased. For example, lithographic tools can be utilized to define gate conductors, conductive lines, vias, doped regions, and other structures associated with an integrated circuit.

In one type of conventional lithographic fabrication process, a photoresist mask is coated over a substrate or a layer above the substrate. The photoresist mask is lithographically patterned by providing electromagnetic radiation, such as, ultraviolet light, through an overlay mask. The portions of the photoresist mask exposed to the electromagnetic radiation react (e.g. are cured). The unreacted portion of the photoresist mask is removed from the substrate or layer, and the pattern associated with the overlay is transposed to the photoresist mask.

The patterned photoresist mask is utilized to etch other mask layers or structures. These mask layers include hard mask layers. The etched mask layers and structures can be used to define doping regions, trenches, vias, lines, etc. Most conventional lithographic fabrication processes have only been able to define structures or regions having a minimum topographic dimension of 100 nanometers (nm) or greater.

As requirements for the size of structures or features on the integrated circuit reach levels below 100 nm or 50 nm, lithographic techniques are unable to precisely and accurately define the feature. For example, it is desirous to reduce the width of the gate conductor (the gate length) associated with a transistor. Future designs of transistors may require that the gate conductor have a width of less than 50 nm. In another example, it is desirous to create contacts or vias having a dimension of less than 50 nm.

Thus, there is a need for an integrated circuit or electronic device that includes transistors having smaller feature sizes. Further still, there is a need for ULSI circuits which do not utilize conventional lithographic techniques to define geometry. Even further still, there is a need for a non-lithographic approach for defining contacts, gates, or other integrated circuit structures having at least one topographic dimension less than 100 nanometers and even less than 50 nanometers.

SUMMARY OF THE INVENTION

An exemplary embodiment relates to a method of manufacturing a small structure on an ultra-large scale integrated circuit. The small structure has a dimension smaller than one lithographic feature. The method includes steps of lithographically patterning a mask layer above a substrate to have a mask feature, oxidizing sidewalls of the mask feature to form at least one oxidized sidewall, removing the oxidized sidewall, and etching the material in accordance with the mask feature without the at least one oxidized sidewall. The mask feature has a dimension which is one lithographic feature wide. The small structure remains after the etching step.

Another embodiment relates to a process of forming a gate conductor having a dimension less than one lithographic feature. The process includes providing a mask layer above a conductive layer above a top surface of a substrate, patterning the mask layer, oxidizing the mask layer, removing oxide sidewalls associated with the mask layer, and etching the conductive layer. The conductive layer is etched in accordance with the mask layer without the oxidized sidewalls to form the gate conductor.

Still another exemplary embodiment relates to a method of manufacturing an integrated circuit including a conductive via. The conductive via has a dimension less than one lithographic feature. The method includes providing a mask layer above a conductive material above a semiconductor substrate, patterning the mask layer to leave a structure, oxidizing sidewalls of the structure, removing the oxidized sidewalls of the structure, and etching the conductive material. The conductive material is etched in accordance with the structure without the oxidized sidewalls to form the conductive via.

BRIEF DESCRIPTION OF THE DRAWINGS

The present invention will hereafter be described with reference to the accompanying drawings, wherein like numerals denote like elements, and.

DETAILED DESCRIPTION OF THE PREFERRED EMBODIMENTS

Figure 1:
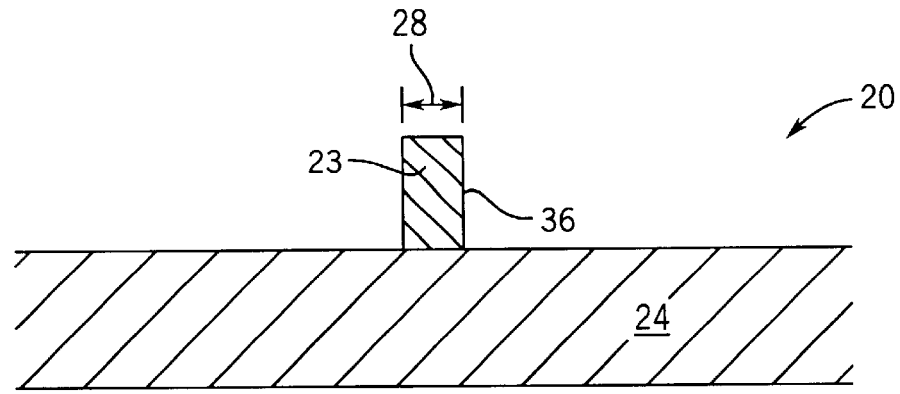
FIG. 1 is a cross-sectional view of a portion of an integrated circuit showing a mask feature formed by a process in accordance with an exemplary embodiment.

With reference to FIG. 1, a portion 20 of an integrated circuit includes a layer 36 and a layer 24. Layer 36 is preferably a mask layer, such as a hard mask, for dimensioning or patterning layer 24. Portion 20 can be any part of an integrated circuit (IC) including a substrate, structures on a substrate, structures on a conductive line above the substrate, structures on a insulative layer, structures within the substrate, or any other portion of the semiconductor device or integrated circuit. The integrated circuit can be any type of integrated circuit including memory circuits, processing circuits, thin film transistors, or other devices. Portion 20 is not shown in a limiting fashion; layer 24 can be utilized on any part of any integrated circuit.

Layer 24 is preferably patterned in accordance with a mask feature 23 formed from layer 36. Layer 36 preferably has been patterned by a lithographic process and is further processed so that mask feature 23 has a dimension such as dimension 28 which is less than one lithographic feature wide. Layer 36 in FIG.1 is configured as a mask feature 23 for defining a small feature in layer 24. Preferably, dimension 28 is less than 100 nanometers and most preferably is less than or equal to 50 nanometers (e.g., between 20–50 nm).

Layer 24 can be any type of substrate or layer utilized in IC fabrication. Preferably, the materials for layers 24 and 36 are chosen for compatibility and intended function. Layer 24 can be an insulative layer, such as tetraethylorthosilicate (TEOS) deposited silicon dioxide or chemical vapor deposited (CVD) silicon nitride ($Si_3N_4$), or a conductive layer, such as doped or undoped polysilicon, titanium, tungsten or aluminum.

Layer 24 can be subject to a dry etching or wet etching process so that it is etched in accordance with layer 36 (e.g., mask feature 23). Mask feature 23 is a small structure, portion of a mask, or other material for shaping or patterning layer 24. Mask feature 23 is manufactured from mask layer 36 such as a germanium hard mask layer. Alternatively, other materials can be utilized to form mask feature 23.

With reference to FIGS. 1–6, the advantageous process for forming the mask feature 23 and hence, patterning layer 24, is described below as follows. As discussed above, mask feature 23 allows features or structures to be formed which have at least one dimension (topographic) less than a minimum conventional lithographic capabilities. Mask feature 23 can define a small structure or feature having a small geometry. The small geometry can be a narrow line as in a polysilicon gate line or a small shape (e.g. square) as in a conductive via.

Figure 2:
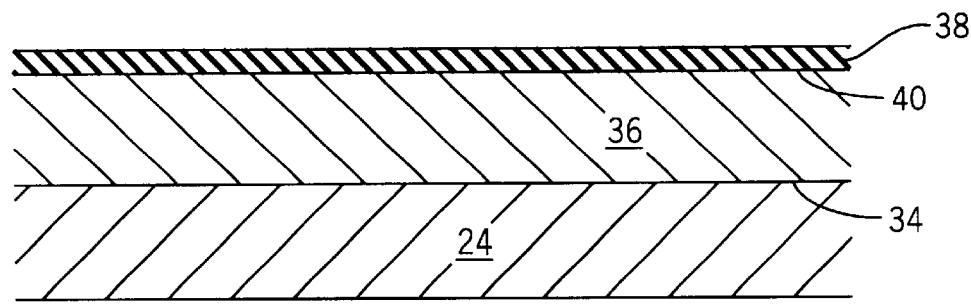
FIG. 2 is a cross-sectional view of the portion of the integrated circuit illustrated in FIG. 1, showing a mask layer and a cap layer deposition step.

In FIG. 2, layer 24 includes a top surface 34. As discussed above, layer 24 can be a variety of materials deposited or grown in a variety of processes. Layer 36 which is associated with mask feature 23 (FIG. 1) is deposited on top surface 34 of layer 24. Preferably, layer 36 is a CVD hard mask layer, such as, a germanium film. Layer 36 preferably has a thickness of 800–1500 Å.

After layer 36 is deposited, a layer 38 is deposited on a top surface 40 of layer 36. Layer 38 is preferably a CVD cap layer, such as, a silicon oxynitride (SiON) cap layer, which has a thickness of 150–250 Å. Alternatively, layer 38 can be silicon nitride ($Si_3N_4$). Layer 38 serves as an anti-reflective coating for superior lithographic capabilities and as a protection layer for layer 36.

Figure 3:
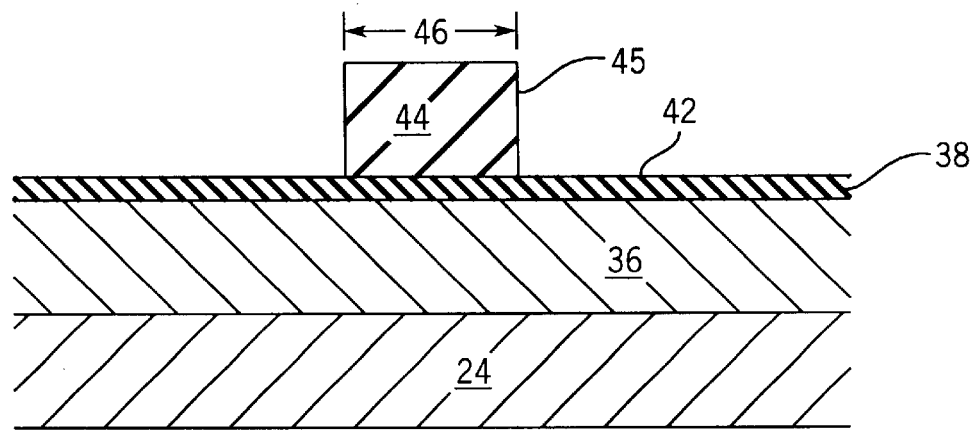
FIG. 3 is a cross-sectional view of the portion of the integrated circuit illustrated in FIG. 2, showing a photoresist application step and a lithographic etching step.

FIG. 3, a photoresist layer 45 is applied above a top surface 42 of layer 38. Photoresist layer 45 is lithographically configured in accordance with a conventional tool to form a pattern including a photoresist structure 44. Various photolithographic processes and materials can be utilized to leave structure 44 on top surface 42 of layer 38. A dimension 46 associated with structure 44 is larger than dimension 28 of mask feature 23 (FIG. 1). Dimension 46 is preferably one minimum lithographic feature wide (e.g. 80–120 nm). The minimum lithographic feature can be affected by the lithographic tool, the wavelength of the light associated with the tool and other lithographic parameters.

Figure 4:
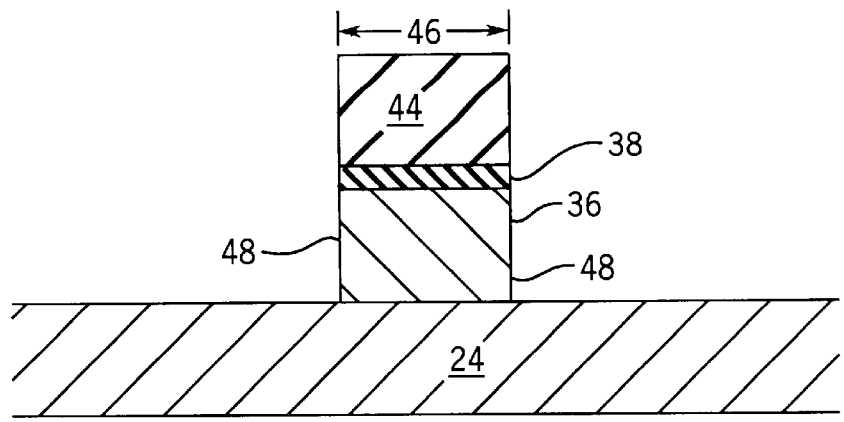
FIG. 4 is a cross-sectional view of the portion of the integrated circuit illustrated in FIG. 3, showing a mask layer etching step and a cap layer etching step.

After structure 44 is formed, layers 38 and 36 are etched in accordance with photoresist structure 44. In FIG. 4, layer 36 remaining underneath structure 44 corresponds to mask feature 23. However, in FIG. 4, layer 36 has a width corresponding to dimension 46 which is larger than dimension 28 (FIG. 1). Layers 38 and 36 can be etched in a dry etching or a wet etching process (preferably a dry etching process). Layers 38 and 36 form a silicon oxynitride germanium stack having sidewalls 48.

Figure 5:
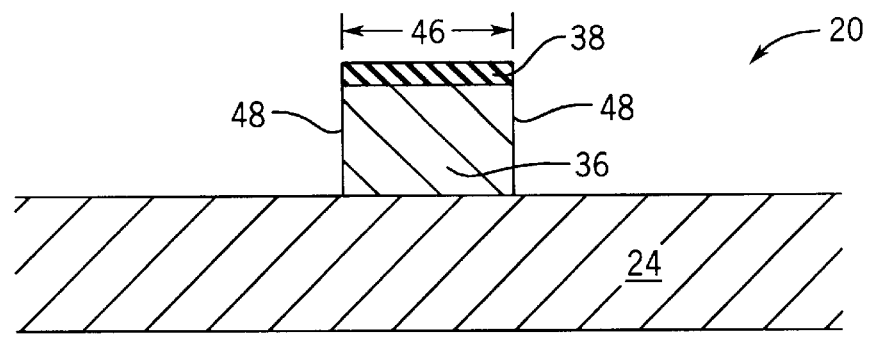
FIG. 5 is a cross-sectional view of a portion of the integrated circuit illustrated in FIG. 4, showing a cap layer removal step and a photoresist removal step.
Figure 6:
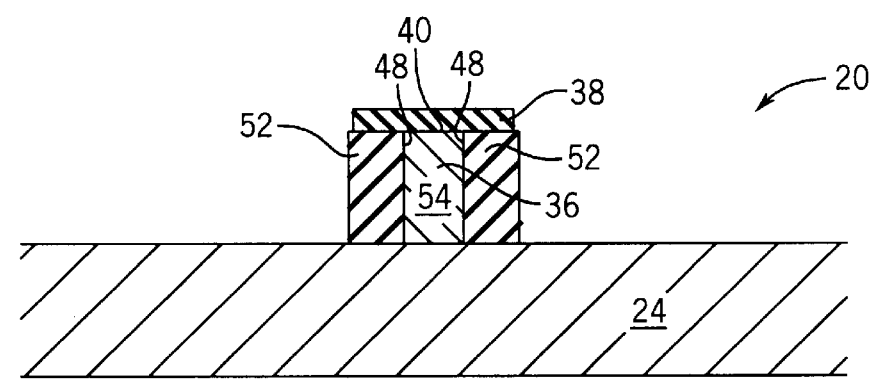
FIG. 6 is a cross-sectional view of the portion of the integrated circuit illustrated in FIG. 5, showing an oxidation step.

After etching layers 38 and 36, structure 44 is stripped or removed in a conventional process (FIG. 5). After structure 44 is removed, sidewalls 48 of layer 36 are oxidized in a thermal process with a diluted oxygen ambient process (FIG. 6). Preferably, portion 20 is heated in an $O_2$ atmosphere to oxidize sidewalls 48 of layer 36. Layer 38 prevents the formation of oxidized material on top surface 40 of layer 36.

In another alternative embodiment, only a single sidewall of sidewalls 48 is oxidized. In such an embodiment, the sidewall which will not be oxidized can be covered by a material similar to layer 38 before oxidation.

As portion 20 is subjected to the oxidation process, portions of layer 36 are consumed as oxide structures 52 are formed on sidewalls 48. Preferably, the degree of oxidation of sidewalls 48 is controlled to control the geometry (dimension 28 in FIG. 1) associated with an unoxidized portion 54 of layer 36. Unoxidized portion 54 corresponds to mask feature 23 (FIG. 1). Preferably, about 70% of layer 36 is etched to leave an unoxidized portion 54. Unoxidized portion can 800–1500 Å thick and 250–350 Å wide. Oxide structures 52 are each 550–850 Å (both side total) wide and 800–1500 Å thick.

After oxide structures 52 are formed, portion is rinsed with a wafer solution. Preferably, structures 52 are germanium oxide and easily dissolved in the solution. Unoxidized portion 54 (e.g., germanium) does not appreciably dissolve in the solution. After structure 52 is removed, layer 38 can be removed by wet chemical etching. In FIG. 1, mask feature 23 remains after structures 52 and layer 38 are removed.

Figure 7:
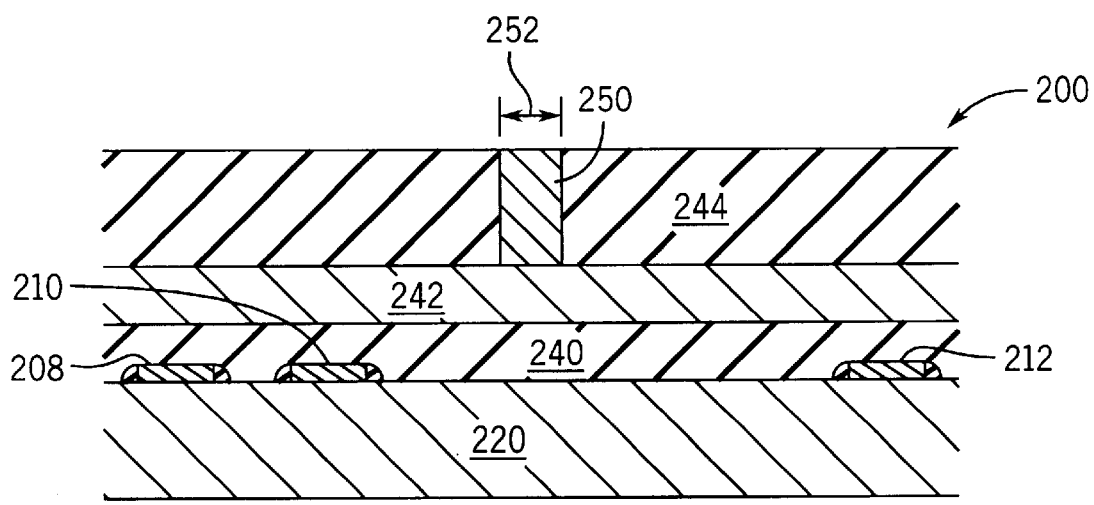
FIG. 7 is a cross-sectional view another portion of another integrated circuit including a conductive via formed by a process in accordance with another exemplary embodiment.

In FIG. 7, a portion 200 includes a conductive via 250 fabricated in accordance with the process described with reference to FIGS. 1–6. The particular process for forming conductive via 250 is discussed in detail below with reference to FIGS. 7–13. Portion 200 is preferably part of an ultra-large scale integrated circuit provided on a substrate 220. Substrate 220 can be a bulk semiconductor substrate, an insulative substrate, or a semiconductor on insulator (SOI) substrate. Substrate 220 houses a number of transistors including transistors 208, 210 and 212.

Transistors 208, 210 and 212 can be N-channel or P-channel MOSFETs or thin film transistors. Transistors 208, 210 and 212 and substrate 220 are covered by an insulative layer 240. Insulative layer 240 can be a silicon dioxide TEOS deposited layer, or any insulative layer. Layer 240 can also be a compound layer.

A layer 242 which is any type of conductive line or layer, is disposed above layer 240. Layer 242 can be a conductive line including a titanium bottom layer and an aluminum upper layer. Layer 242 can also be doped with copper for electromigration resistance. Alternatively, other metals or conductive materials can be utilized for layer 242.

Layer 242 is electrically coupled to conductive via 250. Conductive via 250 can be a tungsten material, an aluminum material, a titanium material, or other metal. According to another alternative, conductive via 250 can be an undoped or doped polysilicon material or a compound material. Insulative layer 244 is disposed above layer 242. Layer 244 can be similar to layer 240.

Conductive via 250 is described as being connected to layer 242 as an example only. Conductive via 250 can be utilized to connect any number and a variety of metal layers (e.g., metal 1, metal 2, metal 3, etc.). In addition, conductive via 250 can be utilized to connect to gate conductors, source regions and drain regions associated with transistors 208, 210 and 212 layer 242. The placement of via 250 in portion 200 is not shown in a limiting fashion.

Preferably, conductive via 250 has a dimension 252 which is smaller than conventional lithographic techniques allow. For example, dimension 252 can be less than 100 nm, most preferably less than 50 nm (20–50 nm). Conductive via 250 can be square-shaped, rectangular-shaped, circular, or other geometry.

Figure 8:
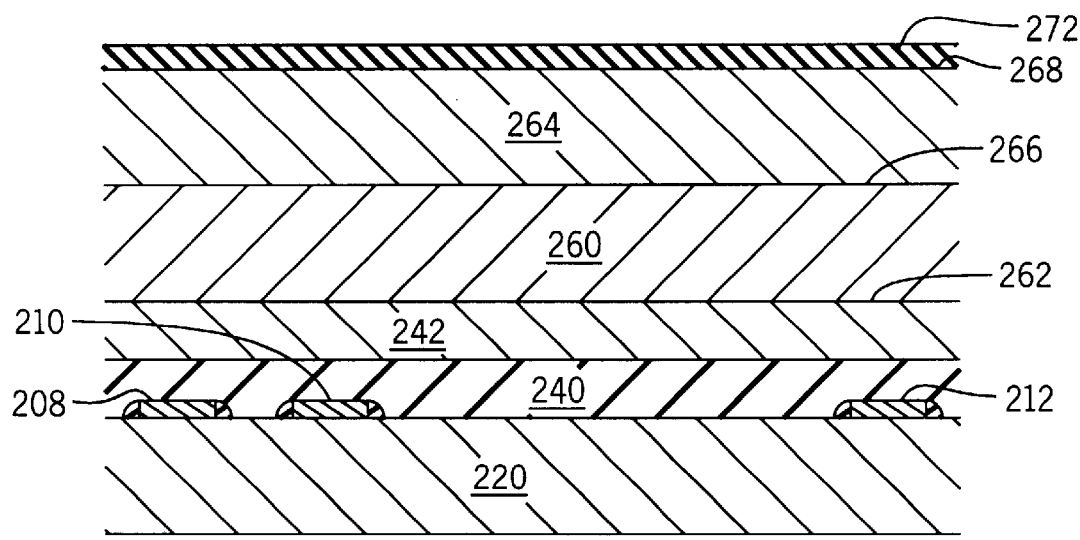
FIG. 8 is a cross-sectional view of the portion of the integrated circuit illustrated in FIG. 7, showing a mask layer deposition step and a cap layer deposition step.

The formation of conductive via 250 is described below with reference to FIGS. 7–13 as follows. With reference to FIG. 8, a layer 260, such as a polysilicon layer, is provided above a planarized top surface 262 of layer 242. Layer 260 can be provided by CVD and corresponds to layer 24 in FIG. 1. Layer 260 is utilized to form conductive via 250 (FIG. 7). Alternatively, layer 260 can be any type conductive material (e.g., metal) deposited by any process. Preferably, layer 260 is 4,000 Å thick.

A mask layer 264 (corresponding to layer 36 in FIG. 1) is provided above a top surface 266 of layer 260 and a cap layer 272 is provided above a top surface 268 of layer 264. Preferably, layer 264 is a germanium film having a thickness of 800–1500 Å and layer 272 is a siliconoxynitride cap layer having a thickness of 150–250 Å.

Figure 9:
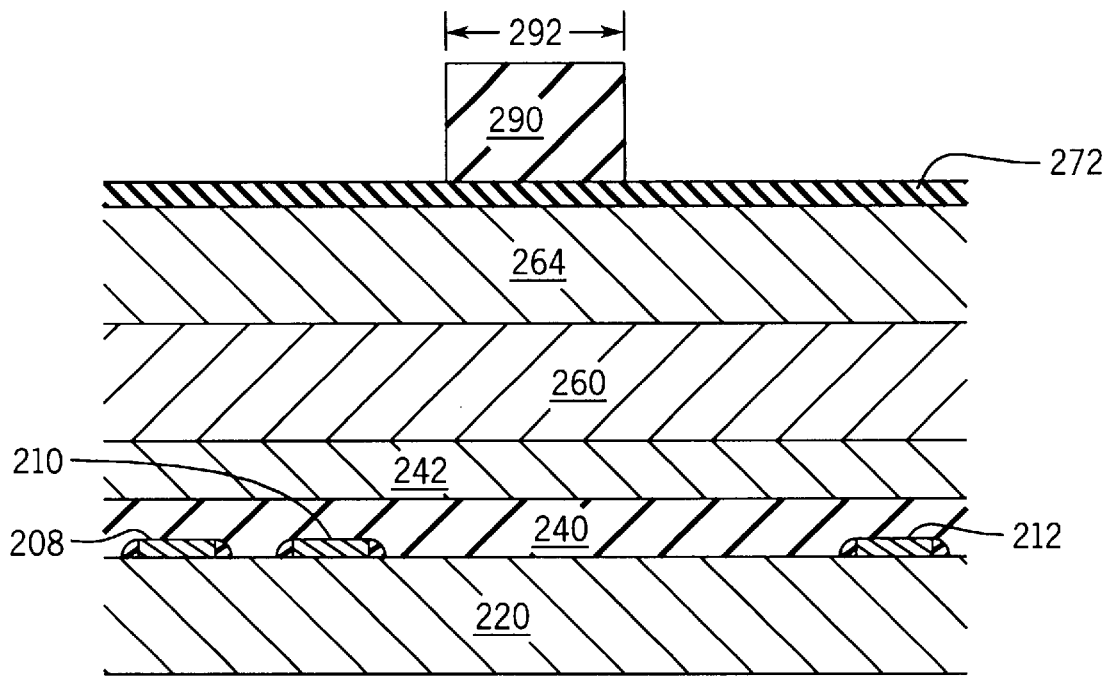
FIG. 9 is a cross-sectional view of the portion of the integrated circuit illustrated in FIG. 8, showing a photoresist application step and lithographic etching step.
Figure 10:
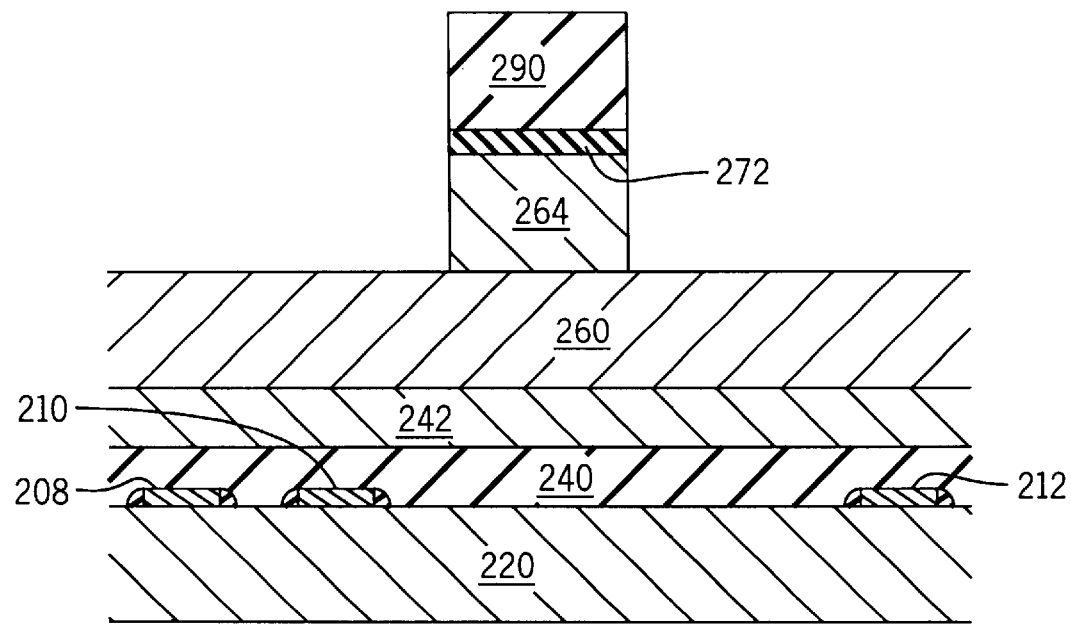
FIG. 10 is a cross-sectional view of the portion of the integrated circuit illustrated in FIG. 9, showing a mask layer etching step and a cap layer etching step.
Figure 11:
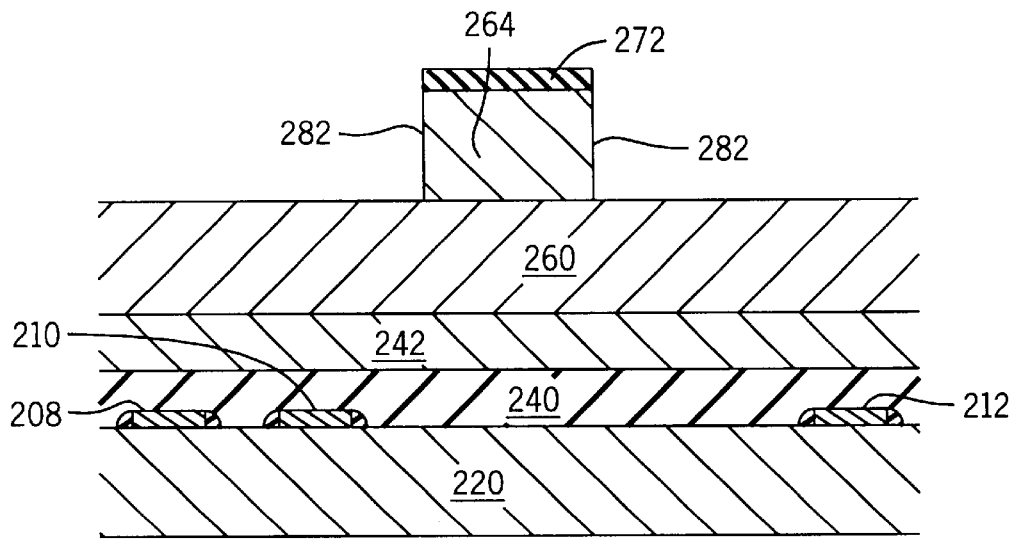
FIG. 11 is a cross-sectional view of the portion of the integrated circuit illustrated in FIG. 10, showing a cap layer removal step and a photoresist removal step.

In FIG. 9, a lithographic structure 290 is formed above layer 272. Structure 290 preferably has a dimension 292 which is greater than dimension 252. In FIG. 10, layers 272 and 264 are etched in accordance with structure 290. Layers 272 and 274 are preferably etched in a dry etching process. In FIG. 11, structure 290 is stripped or removed from layer 272.

Figure 12:
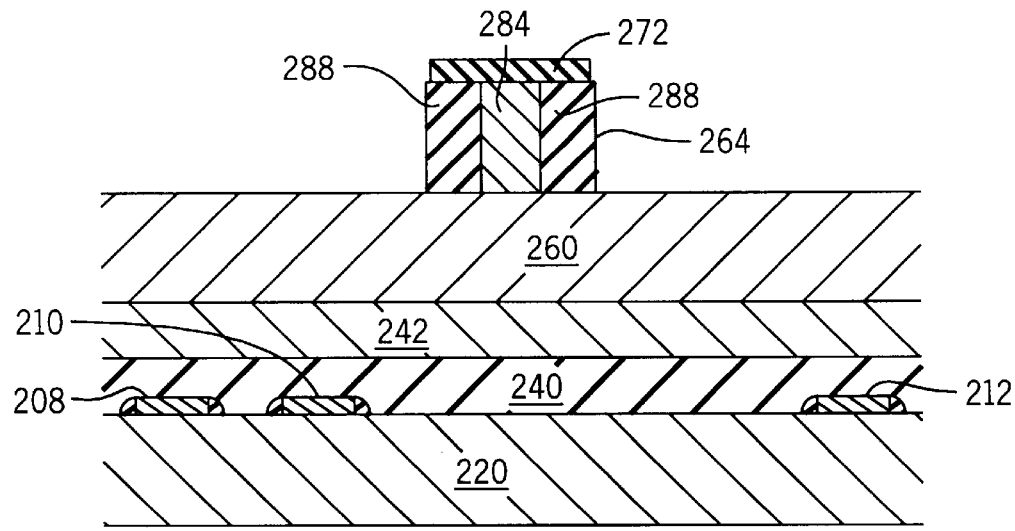
FIG. 12 is a cross-sectional view of the portion of the integrated circuit illustrated in FIG. 11, showing an oxidization step.

In FIG. 12, layer 264 is subject to an oxidation process to oxidize side walls 282. Preferably, side walls 282 are oxidized and consume layer 264 to leave an unoxidized portion 284 between oxidized side walls 288. Oxidized side walls 288 are preferably 800–1500 Å thick and 550–850 Å wide (total of both walls 288). Alternatively, only a single side wall of side walls 282 can be oxidized.

Figure 13:
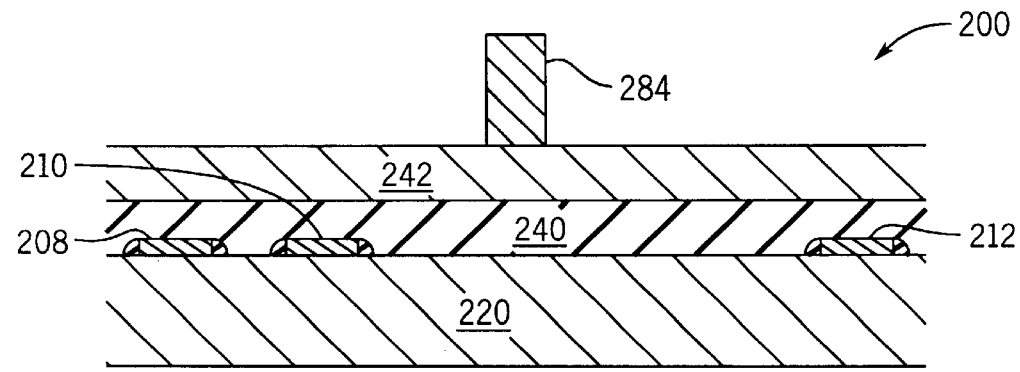
FIG. 13 is a cross-sectional view of the portion of the integrated circuit illustrated in FIG. 12, showing a conductive material etching step.

In FIG. 13, oxidized side walls 288 are removed in a rinsing process and layer 272 is removed by wet etching. After layer 272 is removed, layer 264 is etched in accordance with portion 284 to leave conductive via 250 (FIG. 13).

Layer 244 (FIG. 7) is deposited over layer 242 and conductive via 250. After layer 244 is deposited, a chemical mechanical polish (CMP) can be utilized to planarize the surface of layer 244 and expose conductive via 250. A conductive layer can be deposited above layer 244 and can be coupled to via 50.

Figure 14:
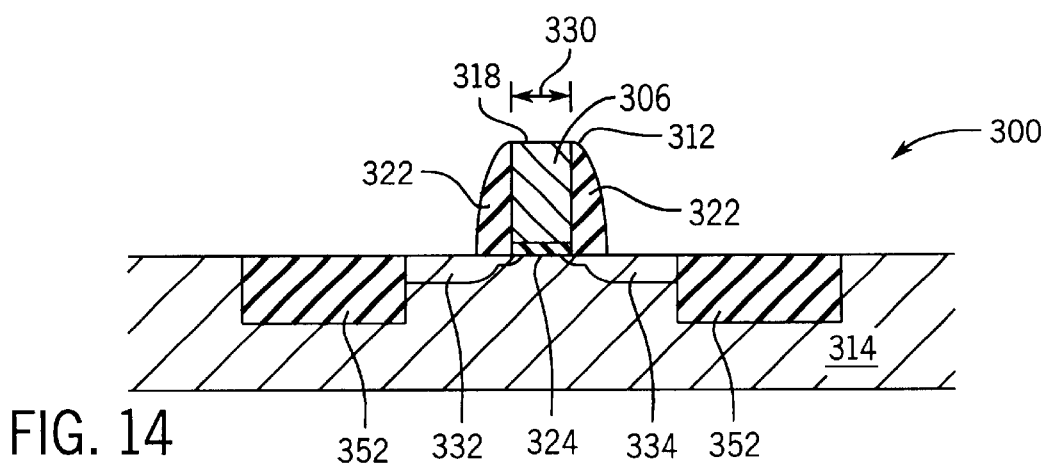
FIG. 14 is a portion of yet another integrated circuit including a transistor having a gate conductor formed by a process in accordance with still another exemplary embodiment.

With reference to FIG. 14, a portion 300 of an integrated circuit includes a transistor 312, such as, a MOSFET provided on a substrate 314. Preferably, portion 300 is part of an ultra-large scale integrated circuit (USI) having one million or more transistors. Portion 300 is manufactured as part of the IC on a semiconductor wafer, such as, a silicon wafer, a silicon-on-insulator (SOI) wafer, an insulative wafer, or other substrate.

Transistor 312 includes a gate stack 318. Gate stack 318 includes spacers 322, gate dielectric 324, and gate conductor 326. Gate conductor 326 and gate dielectric 324 advantageously have a gate length or width 330 which is smaller than the conventional minimum lithographic feature size.

Gate structure 318 is provided in an active region between a source 332 and a drain 334. The active region associated with source 332 and drain 334 is between insulative structures 352. Gate conductor 326 and gate dielectric 324 are preferably patterned in accordance with the advantageous process described with reference to FIGS. 1–6. The particular process for forming gate conductor 326 and gate dielectric 324 is discussed in detail below with reference to FIGS. 15–19.

Figure 15:
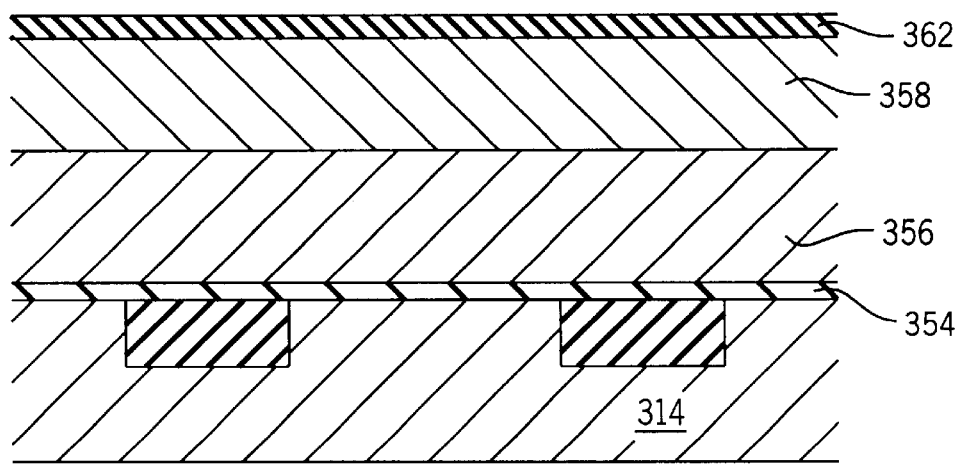
FIG. 15 is a cross-sectional view of the portion of the integrated circuit illustrated in FIG. 14, showing a mask layer deposition step and a cap layer deposition step.

In FIG. 15, a gate oxide layer 354 corresponding to gate dielectric 324 (FIG. 14) is thermally grown above substrate 314. Preferably, gate oxide layer is 10–15 Å thick. A layer 356 corresponding to gate conductor 326 (FIG. 14) is provided above layer 354. Preferably, layer 356 is a 1,000–1500 Å thick layer of polysilicon or metal material. Layer 356 can be doped or undoped and can include germanium. Layer 356 corresponds to layer 24 in FIG. 1.

A mask layer 358 is provided above layer 356 and a cap layer 362 is provided above layer 358. Layer 358 is preferably a 800–1500 Å thick germanium layer, and layer 362 is preferably a 150–250 Å silicon oxynitride cap layer. Layer 358 corresponds to layer 36 in FIG. 1.

Figure 16:
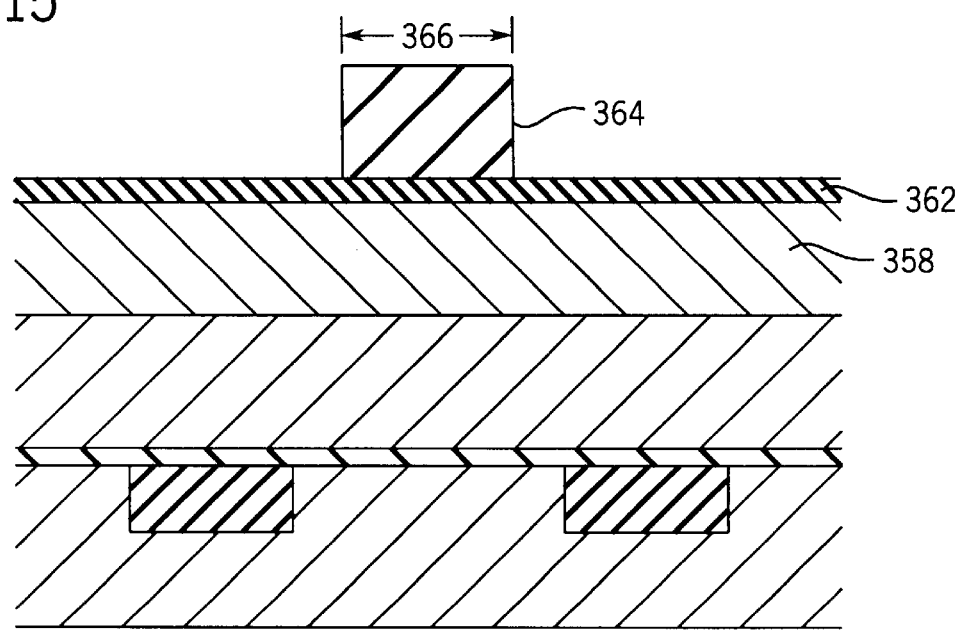
FIG. 16 is a cross-sectional view of the portion of the integrated circuit illustrated in FIG. 15, showing a mask layer etching step and a cap layer etching step.

In FIG. 16, a photoresist structure 364 is provided above layer 362 in accordance with a conventional lithographic process. Structure 364 has a lithographic dimension 366 which is wider than dimension 330 (FIG. 14). Dimension 366 is preferably one the minimum lithographic feature conventional lithographic feature (e.g. 80–120 nm).

Figure 17:
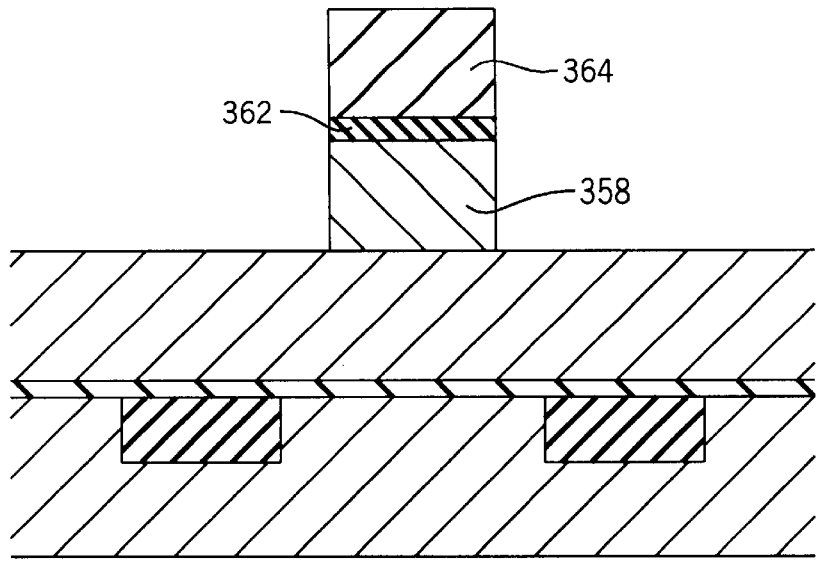
FIG. 17 is a cross-sectional view of the portion of the integrated circuit illustrated in FIG. 16, showing a photoresist application step and a photoresist removal step.
Figure 18:
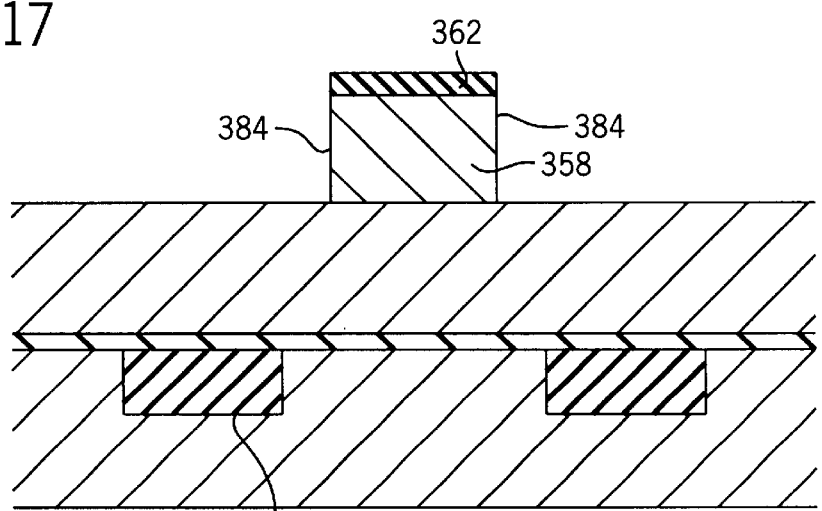
FIG. 18 is a cross-sectional view of the portion of the integrated circuit illustrated in FIG. 17, showing a cap layer removal step and a photoresist removal step.
Figure 19:
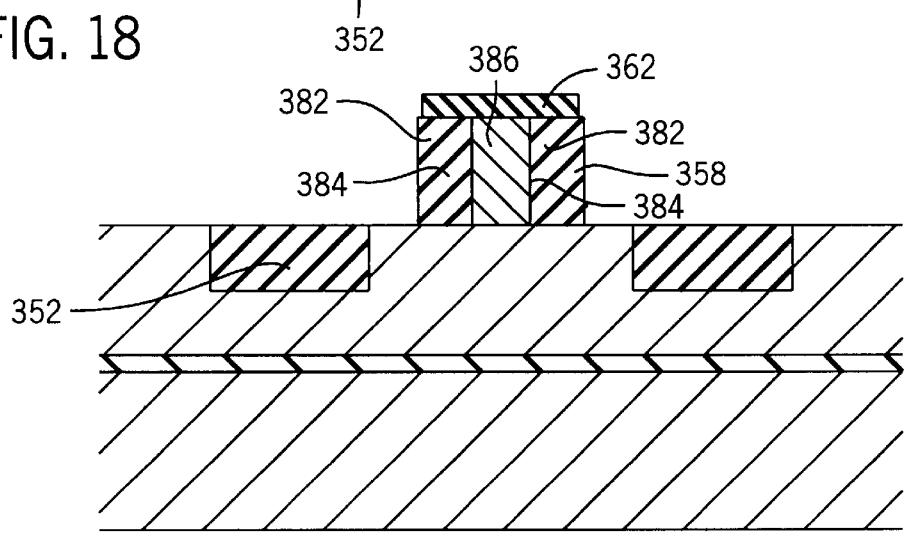
FIG. 19 is a cross-sectional view of the portion of the integrated circuit illustrated in FIG. 10, showing an oxidization step.

In FIG. 17, layers 362 and 358 are etched in accordance with structure 364 by a dry etching process. In FIG. 18, structure 364 is removed from layer 362. After structure 364 is removed, layer 358 is subject to an oxidation process to grow oxide structures 382 on sidewalls 384 of layer 358. Oxidized side walls 358 are preferably grown by thermal oxidation process. Oxidized structures 382 are 250–350 Å wide and 800–1500 thick. An unoxidized portion 386 of layer 382 is 550–850 Å (both side total) wide and 1000–2000 Å thick.

After oxidation, oxidized structures 382 are removed to leave unoxidized portion 386 which corresponds to gate conductor 326. Preferably, unoxidized portion 386 has the same dimension as dimension 330. Structures 382 can be removed by rinsing in a solution of wafer. Thus, a thin or narrow polysilicon gate line, such as, conductor 326 (FIG. 14) can be provided for transistor 312 by utilizing the advantageous germanium hard mask process described above. Conventional CMOS processes can complete the fabrication of transistor 312 and portion 300.

Alternatively, the advantageous process can be utilized to form insulative structures or non-conductive structures. The masks can also be utilized to shield portions of integrated circuits from laser annealing, from doping, can be utilized in any fabrication process requiring hard marks from amorphization.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although particular polysilicon gate structures and conductive vias are described, other types can be formed. Various changes may be made to the details disclosed without departing from the spirit of the invention which is defined by the following claims.

What is claimed is:

1. A method of manufacturing a small structure of a material on an ultra-large scale integrated circuit, the small structure having a dimension smaller than one lithographic feature, the method comprising steps of:

lithographically patterning a mask layer above a substrate to have a first mask feature, the first mask feature having a dimension at least one lithographic feature wide;

oxidizing at least one sidewall of the first mask feature to form at least one oxidized sidewall;

removing the at least one oxidized sidewall to produce a second mask feature having a dimension less than one lithographic feature; and etching the material in accordance with the second mask feature, the small structure remaining after the etching step.

2. The method of claim 1, wherein the mask layer includes germanium.

3. The method of claim 2, wherein the material includes polysilicon.

4. The method of claim 2, wherein the mask layer is covered with a cap layer before the oxidizing step.

5. The method of claim 4, wherein the cap layer includes silicon-oxynitride material.

6. The method of claim 1, wherein the small structure is a gate conductor or a conductive via.

7. A process of forming a gate conductor having a dimension less than one lithographic feature, the process comprising:

providing a mask layer above a conductive layer above a top surface of a substrate;

patterning the mask layer;

oxidizing the mask layer, thereby forming oxide sidewalls on the mask layer;

removing the oxide sidewalls to form a narrowed mask layer less than one lithographic feature in width; and etching the conductive layer in accordance with the narrowed mask layer to form the gate conductor.

8. The process of claim 7, wherein the gate conductor includes polysilicon.

9. The process of claim 8, wherein the mask layer includes germanium.

10. The process of claim 7, wherein the oxide sidewalls are removed by dry etching.

11. The process of claim 7, wherein a gate oxide layer is below the conductive layer.

12. The process of claim 7 further comprising:

depositing a cap layer above the gate conductive layer.

13. The process of claim 12, wherein the cap layer is siliconoxynitride.

14. A method of manufacturing an integrated circuit including a conductive via having a dimension less than one lithographic feature, the method comprising:

providing a mask layer above a conductive material above a semiconductor substrate;

patterning the mask layer, thereby leaving a structure;

oxidizing sidewalls of the structure;

removing the oxidized sidewalls of the structure to form a narrowed structure of less than one lithographic feature in width; and etching the conductive material in accordance with the narrowed structure to form the conductive via.

15. The method of claim 14 further comprising:
covering the conductive via with an insulative material.

16. The method of claim 15 further comprising:
polishing the insulative layer to expose the conductive via.

17. The method of claim 14, wherein the removing step is a dry etching step.

18. The method of claim 14, wherein the mask layer includes germanium.

19. The method of claim 14, wherein the conductive material includes polysilicon.

20. The method of claim 14, wherein conductive via is above and coupled to a conductive line.

* * * * *